United States Patent
Ravid et al.

(10) Patent No.: US 6,654,108 B2
(45) Date of Patent: Nov. 25, 2003

(54) TEST STRUCTURE FOR METAL CMP PROCESS CONTROL

(75) Inventors: Avi Ravid, Kfar Saba (IL); Vladimir Machavariani, Rishon Lezion (IL); Amit Weingarten, Ramat Gan (IL)

(73) Assignee: Nova Measuring Instruments Ltd., Rehovot (IL)

( * ) Notice: Subject to any disclaimer, the term of this patent is extended or adjusted under 35 U.S.C. 154(b) by 322 days.

(21) Appl. No.: 09/789,277

(22) Filed: Feb. 20, 2001

(65) Prior Publication Data

US 2001/0026364 A1 Oct. 4, 2001

(30) Foreign Application Priority Data

Feb. 20, 2000 (IL) .................................. 134626

(51) Int. Cl.$^7$ ............................................. G01N 21/00
(52) U.S. Cl. .................................................. 356/237.2
(58) Field of Search .......................... 356/237.2–237.6, 356/600–624; 438/14–18, 626–631, 691–693, 633; 257/48

(56) References Cited

U.S. PATENT DOCUMENTS

| | | | |
|---|---|---|---|
| 5,663,797 A | 9/1997 | Sandhu | |
| 5,874,318 A | 2/1999 | Baker et al. | |
| 5,933,744 A | 8/1999 | Chen et al. | |
| 6,100,985 A | 8/2000 | Scheiner et al. | |
| 6,433,561 B1 * | 8/2002 | Satya et al. .................. | 324/753 |

FOREIGN PATENT DOCUMENTS

| | | |
|---|---|---|
| WO | 99/23449 | 5/1999 |
| WO | 00/54325 | 9/2000 |

OTHER PUBLICATIONS

U.S. patent Ser. No. 09/326,665; *Method and Apparatus for Monitoring a Chemical Mechanical Planarization Process Applied to Metal–Based Patterned Objects*;Ravid et al.; filed Jun. 7, 1999.

Ravid, A., Sharon, A., Weingarten, A., Machavariani, V, & Scheiner, D. (2000). Copper CMP Planarity Control Using ITM: *Advanced Semiconductor Manufacturing Conference*, 437–443.

Tissier, A., Teissier, J.F., Cerruti, P., & Eymery, J.M. (Nov. 1991). In–Line Monitoring of Some Planarization Processes. *Japanese Journal of Applied Physics*, vol. 30, No. 11B, Part 1, pp. 3178–3181. Tokyo, Japan. XP000263408, ISSN: 0021–4922.

Yu, T., Chheda, S., Ko, J., Roberton, M., Dengi, A., & Travis, E. (Dec. 5–8, 1999). A Two–Dimensional Low Pass Filter Model for Die–Level Topography Variation Resulting from Chemical Mechanical Polishing of ILD Films: *International Electron Devices Meeting (IDEM)*, pp. 909–912. Washington, D.C., U.S.A. XP002178887.

* cited by examiner

*Primary Examiner*—Tu T. Nguyen
(74) *Attorney, Agent, or Firm*—Greer, Burns & Crain, LTD

(57) ABSTRACT

A test structure is presented to be formed on a patterned structure and to be used for controlling a CMP process applied to the patterned structure, which has a pattern area formed by spaced-apart metal-containing regions representative of real features of the patterned structure. The test structure thus undergoes the same CMP processing as the pattern area. The test structure comprises at least two structures aligned along a vertical axis in a spaced-apart parallel relationship, each structure comprising at least one pattern zone containing spaced-apart metal regions, the test structure thereby comprising at least one pair of vertically aligned upper and lower pattern zones. The upper and lower pattern zones in each pair have different patterns oriented with respect to each other such that the metal regions of the lower pattern are located underneath the spaces between the metal regions of the upper pattern.

23 Claims, 4 Drawing Sheets

GENERAL ART

TEST STRUCTURE FOR METAL CMP PROCESS CONTROL

FIELD OF THE INVENTION

The present invention is in the field of optical monitoring techniques, and relates to a test structure to be formed on a real metal-based patterned structure, and a method of controlling a process of chemical mechanical planarization (CMP) applied to the metal-based patterned structure utilizing the test structure. The invention is particularly useful in the manufacture of semiconductor devices such as wafers.

BACKGROUND OF THE INVENTION

In the manufacture of semiconductor devices, aluminum has been used almost exclusively as the main material for interconnects. However, recent developments in this field of the art have shown that copper is poised to take over as the main on-chip conductor for all types of integrated circuits. Compared to aluminum, copper has a lower resistance, namely, less than 2 $\mu\Omega$-cm, even when deposited in narrow trenches, versus more than 3 $\mu\Omega$-cm for aluminum alloys. This property is critically important in high-performance microprocessors and fast static RAMs, since it enables signals to move faster by reducing the so-called "Resistance-Capacitance"(RC) time delay. Additionally, copper has a superior resistance to electro-migration, which leads to lower manufacturing costs, as compared to aluminum-based structures.

During the manufacture of semiconductor devices, a semiconductor wafer undergoes a sequence of photolithography-etching steps to produce a plurality of patterned layers (stacks). Then, depending on the specific layers' structure or a specific production process, the uppermost layer of the wafer may or may not undergo a CMP process to provide a smooth surface of this layer.

When manufacturing aluminum-based structures, the application of a CMP process to the uppermost layer having aluminum-containing regions is usually not needed. As for the copper-based structures (or tungsten-based structure as well), the manufacturing process requires the CMP to be used for removing the residuals of metal. This is true also for processes where aluminum is deposited by the single or dual Damascene process.

With the conventional technology of planarization, interlayer dielectric—ILD polishing occurs after every metal deposition and etching step. The same is not true for damascene processing, wherein the post-polish surface is expected to be free of topography. However, topography is induced because of erosion of densely packed small feature arrays and dishing of the metal surface in large features.

Copper CMP is more complex because of the following: On the one hand, barrier layers (such as tantalum or tantalum nitride) should be removed completely to prevent the so-called "under-polishing" of the wafer, in which case the wafer's surface contains residuals of a layer to be removed. On the other hand, copper should be removed without an excessive over-polishing of any feature (erosion or dishing). This is difficult to implement, because current copper deposition processes are not as uniform as the oxide deposition process. An additional problem is an accumulated layer-by-layer topography or non-planarity across the wafer's surface caused by erosion and dishing effects.

"Erosion" is the phenomenon while that develops during the copper polishing process. FIG. 1 illustrates a stack-like copper-based structure 10 after the application of a CMP process thereto. The structure 10 includes an ILD bottom layer 12, the so-called "etch stop" layer 14 (e.g., SiN), ILD layer portions 16a and 16b, and a dense structure 20 including spaced-apart regions of a copper layer, generally at 18, spaced from each other by ILD layer portions 22 (isolated from the surrounding oxide by a thin barrier layer, which is not specifically shown). Hence, the stack layers of the dense structure 20 are composed of the ILD layer portions 22 and the copper layer portions 18, and are surrounded by the ILD layer portions 16a and 16b.

Such a composite structure 10 having non-uniform mechanical and chemical properties imposes a different a polishing rate or removal distribution over the regions 16a, 16b and 20. Due to different chemical and mechanical properties of the ILD layer portions 16a–16b, as compared to those of the small features in the dense metal-containing (copper) region 20, in some cases, the polishing process proceeds quicker above the region 20 than above the portions 16. The CMP results in a bent-like local profile 24 (concave) of the upper surface of the structure 20. The existence of the profile 24 is called "erosion", presenting the direct loss of ILD and metal (e.g., copper) within a region 22a.

Due to the above-mentioned factors, an additional effect, the so-called "metal line recess" designated 26 takes place presenting another type of defect on the wafer induced by the CMP process applied thereto. Yet another undesirable type of defect induced on the wafer's surface by the CMP process is an effect of barrier layer residues, designated 28, and an effect of the metal polishing called "dishing" and relating to the non-uniform thickness removal across a relatively large non-patterned metallic area.

One possible solution for minimizing the above-mentioned negative effects consists of a tight control of the CMP process, e.g., using a spectroscopy-based optical system (such as the NovaScan 210 commercially available from Nova Measuring Instruments Ltd., Israel). However, as the measured layer level increases, the complexity of the layer stack (consisting of multiple levels of OX/Etch Stop/OX/Cap layers) impairs the measurement accuracy. This is due to the fact that optical measurements are performed in predetermined sites within the wafer's dies consisting of measuring the optical response of a top layer stack in these sites while the measured parameters are affected by underlying layers. Separating the influence of underlying layers from that of the top layer stack signal presents a sophisticated problem.

SUMMARY OF THE INVENTION

There is accordingly a need in the art to facilitate the control of a CMP process when being applied to a patterned structure such as a semiconductor wafer having metal (e.g., copper) regions, by providing a novel test structure for tight control of the CMP process by processing the test structure with the same CMP as the patterned structure with real features and applying optical measurements to the test structure.

The main idea of the present invention consists of providing such a test structure that, when optical measurements are applied to a measurement area of the top surface of the test structure to detect a light response (in particular, reflection) of the measurement area, the contribution of layers or levels underneath the measurement area to the light response is substantially reduced. Additionally, the test structure is such that, when it is processed by the CMP, a desirable planarity of the measurement area within the test structure is provided. This is implemented by providing the test structure with at least two structures aligned along a vertical axis in a spaced-apart parallel relationship, each pattern structure comprising at least one pattern zone containing spaced-apart metal regions, the test structure thereby comprising at least one pair of vertically aligned upper and lower pattern zones. The upper and lower pattern zones in each pair have different patterns (i.e., different pitch values and, optionally, also different duty cycle values), and are oriented with respect to each other such that the metal regions of the lower pattern are located underneath the spaces between the metal regions of the upper pattern within the measurement area.

Thus, according to one aspect of the present invention, there is provided a test structure, which is to be formed on a patterned structure, progressing on a production line and having a pattern area having metal-containing regions and being representative of real features of the patterned structure, so as to enable concurrent application of a Chemical Mechanical Planarization process to a top surface of the test structure and to a top surface of said pattern area, wherein the test structure comprises at least two structures aligned along a vertical axis in a spaced-apart parallel relationship, each structure comprising at least one pattern zone containing spaced-apart metal regions, the test structure thereby comprising at least one pair of vertically aligned upper and lower pattern zones, the upper and lower pattern zones in each pair having different patterns oriented with respect to each other such that the metal regions of the lower pattern are located underneath the spaces between the metal regions of the upper pattern.

The number of such pairs of upper and lower structures in the test structure depends on a specific manufacturing step after which the CMP is to be applied to the patterned structure progressing on a production line.

Each of the upper and lower structures may comprise at least one additional pattern zone containing spaced-apart metal regions, the two pattern zones being spaced by a zone having no metal regions. In this case, the two pattern zones of the same level structure are different, namely, have different pitch values and, optionally, also different duty cycle values. The upper and lower structures may be identical, and, in order to provide the above relative orientation of each pair of the upper and lower patterns, the structures can be shifted with respect to each other at a 180°-angle. Generally, the less the overlap (along the horizontal axis) between the identical pattern zones of the upper and lower pattern layers, the better the optical isolation of the lower structure. Preferably, in order to provide such a minimal overlap, the pitches $\Delta_1$ and $\Delta_2$ and duty cycles $D_1$ and $D_2$ of the upper and lower patterns, respectively, satisfy the following relationships: $\Delta_2=K\cdot\Delta_1$; $D_2=100\%\cdot(1-(K\cdot D_1/100\%))$, wherein K are integer numbers. If the upper and lower patterns in the pair (i.e., vertically aligned) have the same cycles, in order to provide the effect of optical isolation between the upper and lower structures, the patterns should be shifted with respect to each other by half the pattern period.

The test structure may comprise a plurality of spaced-apart pattern layer structures. In this case, each two locally adjacent (along a vertical axis) patterns are aligned along two mutually perpendicular horizontal axes, such that the metal regions therein are perpendicular to each other.

According to yet another aspect of the present invention, there is provided a patterned structure that has a pattern area formed by spaced-apart metal-containing regions representative of real features of the patterned structure, and is formed with a test site containing a test structure, which comprises at least two structures aligned along a vertical axis in a spaced-apart parallel relationship, each structure comprising at least one pattern zone containing spaced-apart metal regions, the test structure thereby comprising at least one pair of vertically aligned upper and lower pattern zones, the upper and lower pattern zones in each pair having different patterns oriented with respect to each other such that the metal regions of the lower pattern are located underneath the spaces between the metal regions of the upper pattern.

According to yet another aspect of the present invention, there is provided a method of controlling a process of Chemical Mechanical Planarization (CMP) applied to a group of similar patterned structures progressing on a production line, each pattern structure having a pattern area formed by spaced-apart metal-containing regions representative of real features of the patterned structure, the method comprising the steps of:

(a) forming at least one of the patterned structures progressing on a production line with a test site containing a test structure, which comprises at least two structures aligned along a vertical axis in a spaced-apart parallel relationship, each structure comprising at least one pattern zone containing spaced-apart metal regions, the test structure thereby comprising at least one pair of vertically aligned upper and lower pattern zones, the upper and lower pattern zones in each pair having different patterns oriented with respect to each other such that the metal regions of the lower pattern are located underneath the spaces between the metal regions of the upper pattern;

(b) applying the CMP process to the test site, thereby processing both the test structure and the pattern area;

(c) applying optical measurements to the processed test structure to detect an optical response of the test structure, wherein the optical response is substantially not affected by a light response of layers of the test structure located underneath the lower structure;

(d) analyzing the detected optical response to determine whether there exists at least one of erosion and dishing effects caused by the CMP processing, the analysis of the optical response enabling to adjust a working parameter of the CMP process prior to applying the CMP process to another patterned structure.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF THE INVENTION

More specifically, the present invention is used for controlling a CMP process applied to semiconductor wafers (constituting patterned structures with real pattern features) progressing on a production line in the semiconductor devices' manufacture, and is therefore described below with respect to this application.

Figure 1:
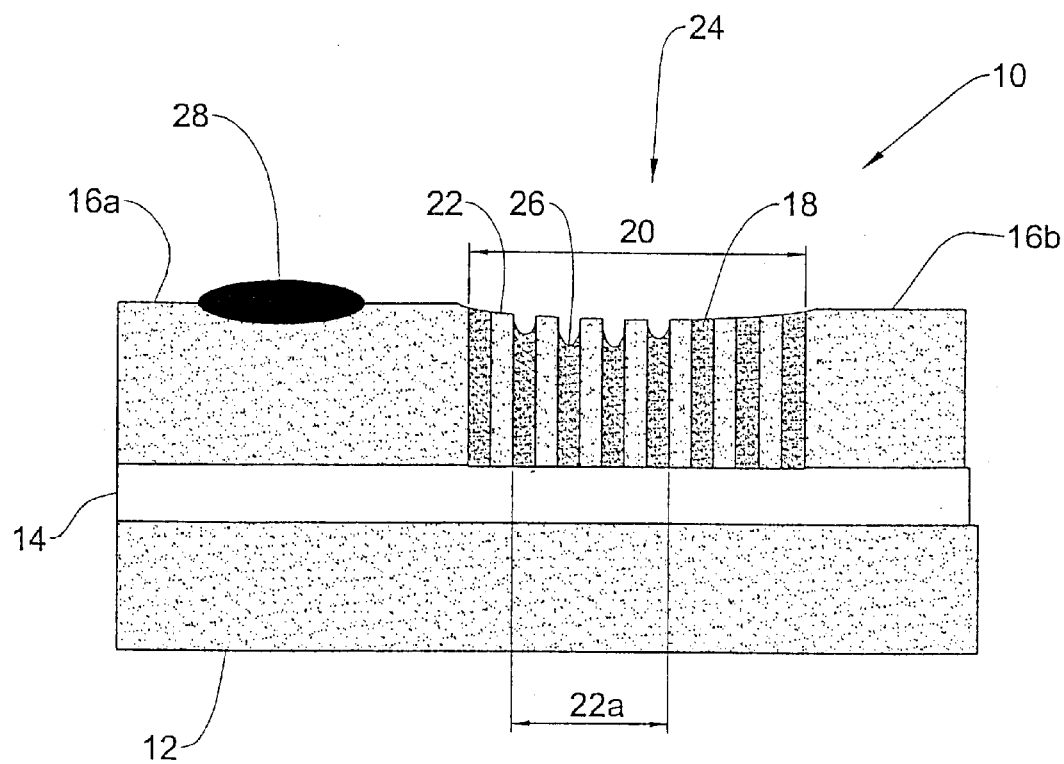
FIG. 1 is a schematic illustration of a section of wafer's fragment after the application of the CMP process thereto in a conventional manner, showing more specifically the erosion, metal recess and residual effects.

FIG. 1 illustrates the stack-like copper-based structure 10 that has undergone the CMP processing, showing the undesirable effects of erosion, metal line recess barrier layer residues, and dishing.

The following are several possible examples of a test structure according to the invention. The test structure is to be located in the scribe lines (or margin region) of a wafer, thereby enabling optical measurements of desired parameters of the test structure for tight monitoring of the CMP process applied to the wafers.

Figure 2:
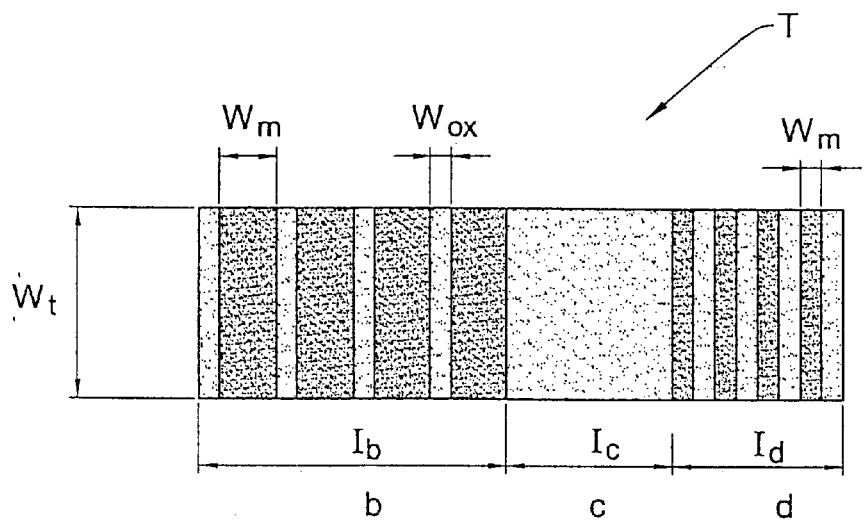
FIG. 2 is a schematic top view of a structure to be used in a test structure according to one embodiment of the present invention.

Referring to FIG. 2, there is illustrated the top view of a structure T suitable to be used in a test structure according to the present invention. The structure T has the width $W_t$, and includes different pattern areas or zones—two such zones, b and d, in the present example, which are characterized by different pitches, $\Delta$, and duty cycles, D, and are spaced by an unpatterned dielectric zone c. Each of the patterns in the zones b and d is formed by spaced-apart metal regions (lines) spaced by oxide lines. The pitch, $\Delta$, is a distance between corresponding points on two locally adjacent similar pattern elements. Here, the pitch $\Delta$ is defined as the sum of the width $W_m$ of a metal line and the width $W_{ox}$ of an oxide line or space, $\Delta=W_m+W_{ox}$. The duty cycle, D, is defined as the ratio between the metal line's width $W_m$ and the pitch $\Delta$, i.e., $D=W_m/\Delta$.

In the present example, the zone b is characterized by a duty cycle $D_b$ that substantially exceeds 50% (and is preferably about 75%), i.e., the width, $W_m$, of the metal line is substantially larger than the width $W_{ox}$ of the oxide line in this zone. The zone b actually presents the so-called "metal rich pattern". The zone c comprises a substantially uniform oxide layer that models the field oxide conditions. The zone d, in this specific example, is characterized by a duty cycle $D_d$ of about 50%, i.e., the width $W_m$ of the metal line is equal to the width $W_{ox}$ of the oxide line or space in this zone. Preferably, the length $l_b$ of the zone b is at least equal to a summarized length of zones c and d, i.e., $l_b \geq l_c + l_d$.

The design rules of the area d of the structure T relate to the specific metal polish process to be monitored and to the critical structure or pattern in the wafer's die. The pattern duty cycle D and the pitch $\Delta$ in this area are chosen so as to give a good correlation to a certain property inside the die. In most instances, the pattern in the area d has a duty cycle of 0.5 with the minimum or the most common line width to be found in the active area of the wafer. It should be noted that the pitch $\Delta$ of the pattern within this zone d is chosen due to the limitations of the measuring and interpretation technique. Other process parameters, such as the slurry chemical selectivity and the most prominent effect to be monitored, should also be considered. For example, the use of slurry with a high rate of oxide removal compared to metal removal may require monitoring of the level of oxide loss rather than the metal loss.

The main two aspects define the design rules of the area b: On the one hand, it is necessary to isolate the lower levels' contribution by introducing a relatively opaque layer or extremely rich metal pattern. On the other hand, introducing a large metal area will evidently cause dishing and will severely affect the measurement area planarity. Another consideration in choosing the pitch $\Delta$ of the pattern within the zone b could be the limitations of the measuring and interpretation technique.

The measuring technique does not form part of the present invention and need not be specifically described, except to note the following. One example of the measuring technique that could be applied to the structure T designed in accordance with the present invention is disclosed in the co-pending U.S. Pat. No. 6,100,985 assigned to the assignee of the present application, which is therefore incorporated herein by reference with respect to this specific example. This measuring technique utilizes a model capable of determining theoretical data representative of the photometric intensities of light components of different wavelengths reflected from the structure, and calculating desired parameters (e.g., thickness) of the structure layers. Specific dimensions of the structures applicable in this measuring technique, i.e., width $W_t$ and lengths $l_c$, and $l_d$ are preferably of at least 30 $\mu$m. Alternatively or additionally, according to the dimensions of the pattern structure, different known diffraction techniques, such as Rigorous Coupled Wave Theory (RCWT) for example, could be used for measuring. Another example of the technique that could be used for measuring desired parameters of a structure designed in accordance with the present invention is disclosed in the co-pending U.S. application Ser. No. 09/326,665, now U.S. Pat. No. 6,292,265 assigned to the assignee of the present application, which is therefore incorporated herein by reference. Measurements in the zone c can provide the dielectric layer stack thickness, used for the metal level determination, and the zone d could be used for the erosion, local dishing (or line recess) and metal lines thickness measurements. The zone b is intended to provide additional information on metal (e.g., Cu) removal, but the main function thereof is to avoid, or at least substantially reduces the optical contribution for the lower "levels" by introducing a relatively opaque area thereabove.

Figure 3:
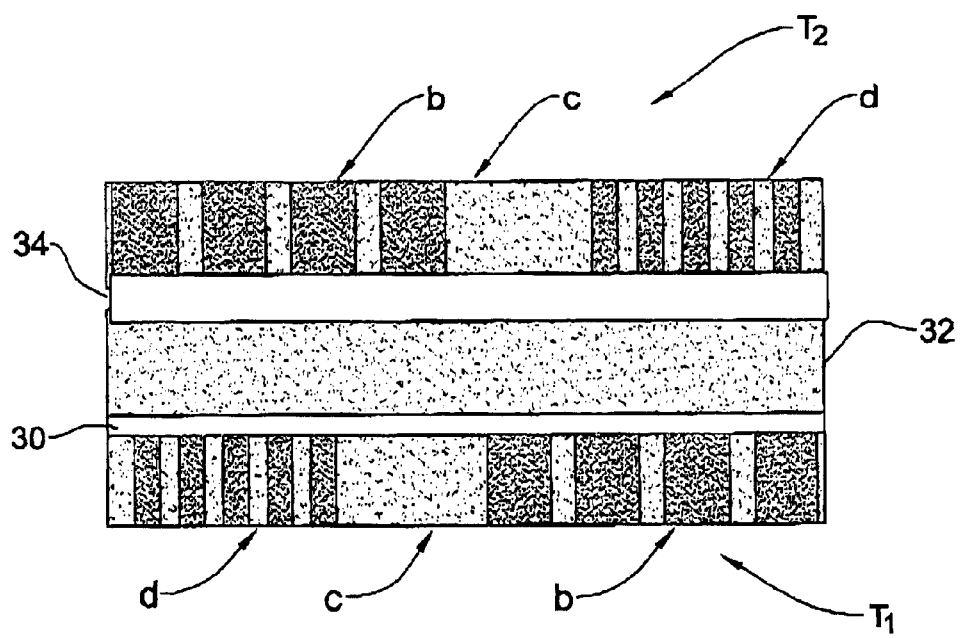
FIG. 3 is a schematic illustration of a test structure according to the invention, utilizing the structure of FIG. 2.

Reference is now made to FIG. 3 schematically illustrating a test structure according to the invention, being composed of two vertically aligned spaced-apart structures $T_1$ and $T_2$ presenting, respectively, two adjacent "levels" or pattern layers. Each of the test structures $T_1$ and $T_2$ is constructed similar to the structure T of FIG. 2, namely, comprises three zones b, c and d. One of the structures is 180°-rotated with respect to the other structure, in order to avoid or substantially reduce the optical contribution of the lower layer test structure $T_1$ during optical measurements applied to the upper layer test structure $T_2$.

According to the conventional technology of manufacturing of semiconductor devices, a semiconductor wafer is manufactured by sequential deposition of layers of different materials. Such a wafer could comprise, for example, about 20–30 different layers. In the present example of FIG. 3, only layers laid between the two test structures bearing layers are shown. The test structures $T_1$ and $T_2$ bearing layers are separated by a "cap layer" 30, an oxide layer 32, and an "etch stop" layer 34.

Thus, the zone b of the upper structure $T_2$ is located above the zones c and d of the lower structure $T_1$, and the zones c and d of the structure $T_2$ are located above the zone b of the lower structure $T_1$. The minimal overlap (along a horizontal axis) between the spaces of two adjacent (in the vertical direction) pattern structures provides sufficient optical isolation of underneath layers. An additional effect provided by such inverted orientation of the adjacent level test structure is the planarity of the structure after being processed by the CMP, due to interleaving of zones with different erosion/dishing effects. It is readily appreciated, that each consequent or upper level structure has an inverted orientation with respect to that of the lower level and vice versa. Although in the present example, each of the lower and upper layer structures $T_1$ and $T_2$ comprises two different pattern zones, it should be understood that the case may be such that only one pattern zone is provided in each of the lower and upper layer structures of the test structure, provided the upper and lower patterns are oriented with respect to each other such that the metal regions of the lower pattern are located underneath the spaces between the metal regions of the upper pattern.

Figure 4A:
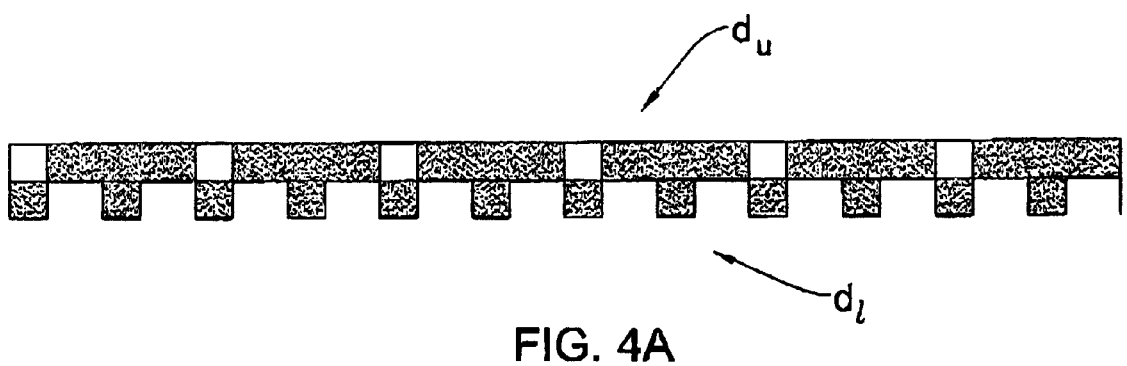
FIGS. 4a and 4b schematically illustrate overlapping along a horizontal axis of the patterns of two structures locally adjacent along a vertical axis.
Figure 4B:
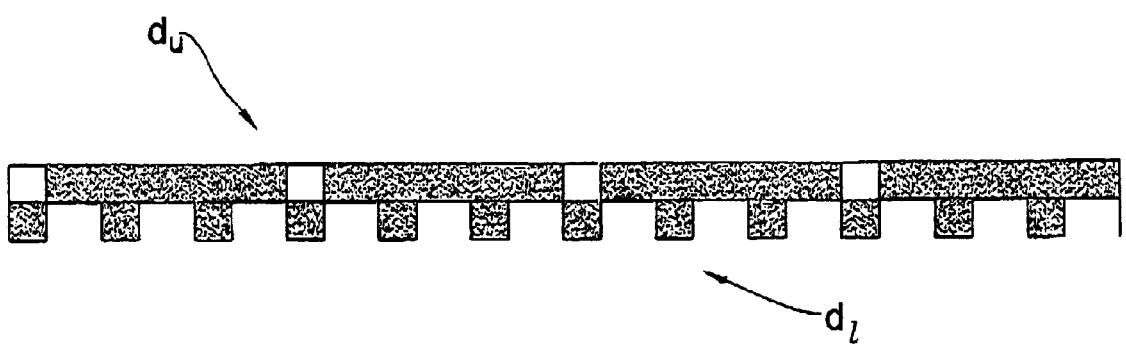

Reference is made to FIGS. 4a and 4b, illustrating two examples of specific dimensions of the test structures' patterns in accordance with the present invention. As shown in FIG. 4a, in this specific example, the pattern of zone $d_u$ of the upper level structure is characterized by a duty cycle $D_1$ of 75%. The corresponding underneath level zone $d_l$ is characterized by a duty cycle $D_2$ of 50%. The layers between the pattern layers are not shown to simplify the explanation. FIG. 4b illustrates still another example of upper and lower pattern structures, characterized by duty cycles $D_1$ and $D_2$ of 83% and 50%, respectively.

Preferably, in order to provide a minimal horizontal overlap between the spaces of two adjacent (in the vertical direction) pattern structures, the following relations between the pitches $\Delta_1$ and $\Delta_2$ and duty cycles $D_1$ and $D_2$ of the upper and lower patterns, respectively, could be used:

$$\Delta_2 = K \cdot \Delta_1; \quad D_2 = 100\% \cdot (1 - K \cdot D_1/100\%),$$

wherein K are integer numbers.

It should be noted that non-integer values of K could also be used, but in that cases, the calculation of an "isolation" pattern will be more complicated.

It should also be noted that, in some cases, the patterns with equal duty cycles $D_1$ and $D_2$ could be used. In such cases, for providing the effect of optical isolation, the patterns should be shifted with respect to each other by half the pattern period.

Turning back to FIG. 3, the pitch and duty cycle of the area d is determined by the process requirements. The area b is a metal rich one (at least 50% density) in case of the cooper based technology, with the pitch and duty cycle such that the overlapping spaces between the areas b and d at the surface (along the horizontal axis) preferably do not exceed 10%.

Figure 5:
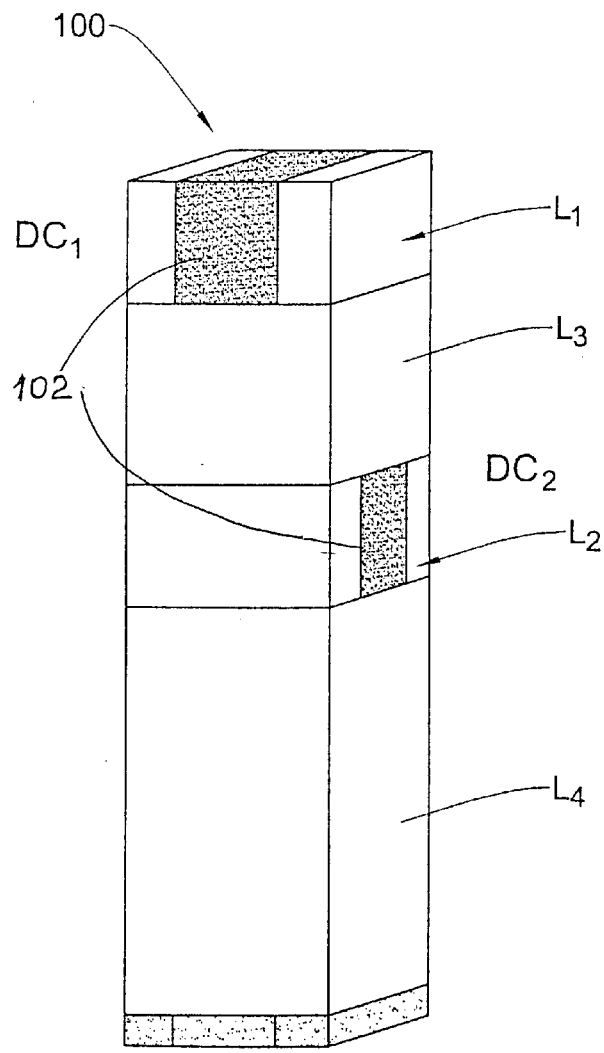
FIG. 5 illustrates a test structure according to another embodiment of the present invention.
Figure 6:
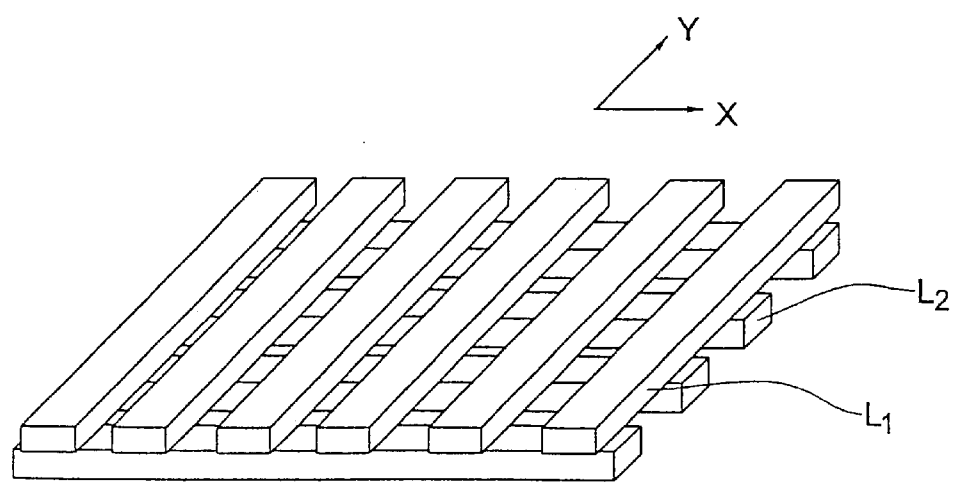
FIG. 6 more specifically illustrates the relative arrangement between the patterns in upper and lower structures of the test structure of FIG. 5.

FIG. 5 illustrates a test structure 100 according to another embodiment of the invention to be used for erosion monitoring during the metal polish. The test structure 100 is a pad (e.g., with the size of 50×50 microns) which is formed of two spaced-apart pattern structures $L_1$ and $L_2$ or layers filled by metal lines, generally at 102 (with the pitch, $\Delta$, being preferably no more than 0.4 µm, e.g. of 0.32, 0.36 or 0.40 microns, and the metal density of preferably 50% (Duty Cycle, DC, of 0.5)), an ILD layer $L_3$ between the structures $L_1$ and $L_2$, and a bottom ILD layer $L_4$. With regard to the pattern pitch, it should be understood that the less the pitch value, the better the result. Each of the pattern layers (containing at least one pattern of spaced-apart metal regions) presents a pattern structure. The pattern structure in each layer is located exactly above the pattern structure in the previous layer. As shown, the mutual orientation of the structures $L_1$ and $L_2$ is such that the patterns containing the metal lines 102 in these two structures are aligned along two mutually perpendicular horizontal axes, as better seen in FIG. 6.

It should be understood that, depending on the specific manufacturing steps after which a CMP processing should be applied to the wafer (patterned structure), the test structure may comprise more than two layer structures, provided each pair of locally adjacent upper and lower pattern structures is oriented such that the metal regions in the lower structure are located underneath the spaces between the metal regions of the upper structure. More specifically, considering, for example, seven pattern structures (layers) in the test structure 100, in each of the first, third, fifth and seventh pattern structures, the metal lines containing patterns are aligned along the X-axis, and in each of the second, fourth and sixth pattern structures, the metal lines containing patterns are aligned along the Y-axis. Thus, the metal lines 102 in each pattern structure are perpendicular to the metal lines in the previous pattern structure. As a result, the previous layer's pattern structure will serve as a metal substrate, from the point of view of the optical measurements.

This test structure 100 utilizes the well-known phenomenon (both in radio physics and far infrared optics) consisting of that the parallel metal lines work as a polarizer if the pitch $\Delta$ is smaller than the wavelength $\lambda$. The smaller the ratio $\Delta/\lambda$, the better the polarizer. The set of the parallel metal lines on a ZnSe substrate (optically transparent substance for far infrared (IR) spectrum) is successfully used as a polarizer for CO-laser IR light.

For example, if the measurement range is 450–900 nm, then the metal lines in $N^{th}$ pattern layer with pitches of 0.32, 0.36, 0.40 microns (i.e., preferably, not exceeding 0.4 µm) work as a polarizer. It means that the transmitted light, i.e., the light that can penetrate into the deeper layers will have TM polarization (electric field vector is perpendicular to the metal lines). The TE polarization (i.e., electric field vector is parallel to the metal lines) will be reflected by the structure of the upper pattern layer (lines of Cu in $SiO_2$). For the test structure in the previous, $(N-1)^{th}$, pattern layer, the light transmitted through the structure in $N^{th}$ pattern layer will have TE polarization, because these pattern structures are perpendicular to each other. Therefore, the $(N-1)^{th}$ structure reflects practically all the light. This technique simplifies the interpretation of the measured spectra, because the $(N-1)^{th}$ structure behaves as a metal (Cu) substrate.

Figure 7:
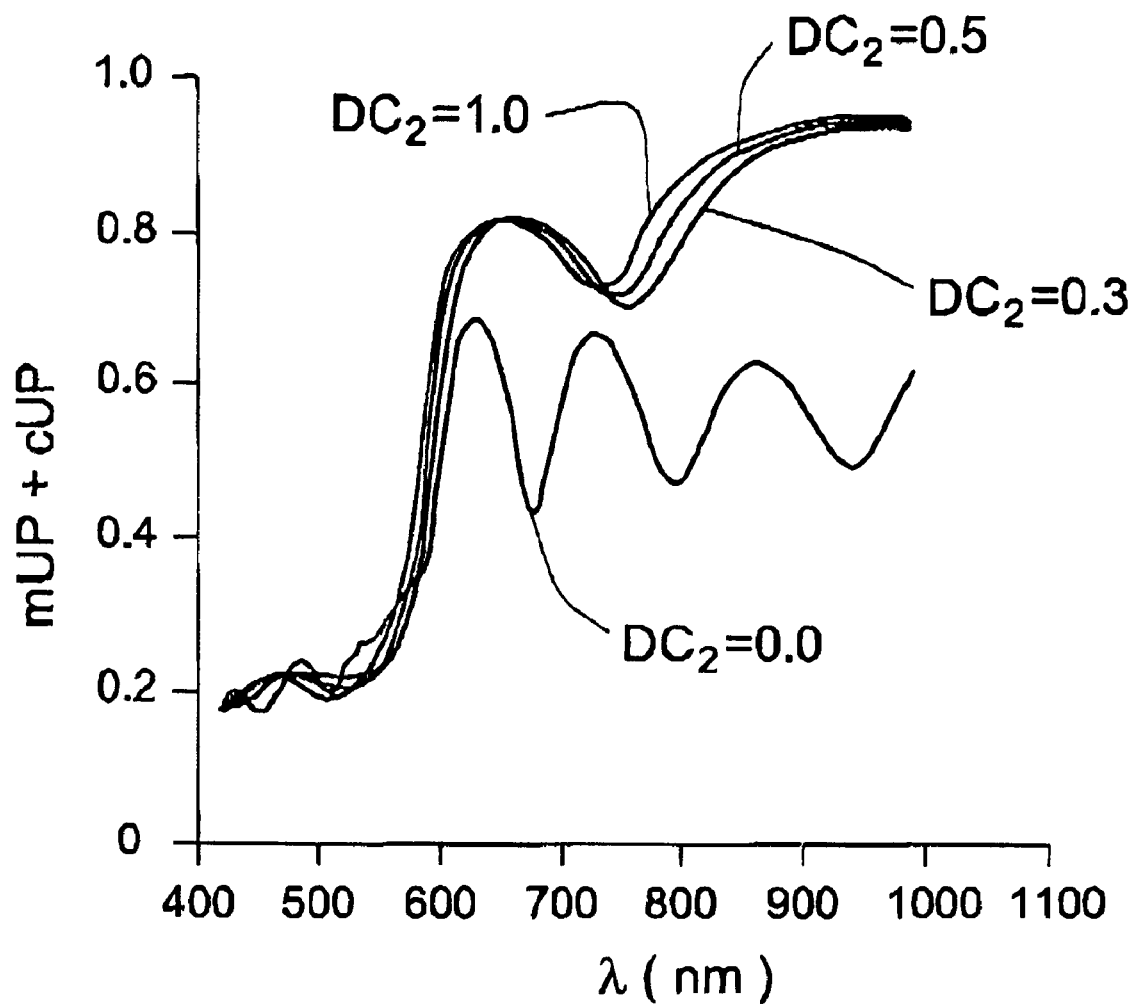
FIG. 7 illustrates the results of optical measurements applied to the test structure of FIG. 5.

FIG. 7 presents the calculated spectra from the test structure 100 with the perpendicular lines of Cu in different layers (locally adjacent pattern layers). The thicknesses of the Cu lines 102 are 2000 Å, the thickness of the lower oxide layer $L_4$ is 7000 Å, and the thickness of the upper oxide layer $L_3$ is 3000 Å. $DC_1$ (FIG. 5) is a duty cycle of the upper metal layers $L_1$ (with the metal lines containing pattern aligned along the X-axes) and $DC_2$ is the duty cycle of the lower metal layer $L_2$ (with the metal lines containing pattern aligned along the Y-axis, i.e., perpendicular to those of the upper layer). The metal substrate corresponds to $DC_2=1.0$. As shown, while the spectra for $DC_2=1.0$ (Cu substrate), $DC_2=0.5$ and $DC_2=0.3$ are practically coinciding, the difference between the spectra for $DC_2=0.0$ (no Cu line) and $DC_2>0.3$ is huge. Hence, the lower layer $L_2$ of the perpendicular Cu lines behaves like a Cu solid substrate.

The test structure of the present invention can be utilized in a CMP monitoring application. This monitoring can be performed using stand-alone or the so-called "integrated monitoring" (IM) technique. Integrated monitoring (IM) technique, for example, performs almost real-time CMP monitoring and could be used for providing close loop control (CLC). The CMP might be altered, if desired, based upon monitoring of each or selected previous wafers, thereby performing tight process control.

Thus, a semiconductor wafer formed with a test site according to the invention within the scribe lines of the wafer, is supplied to a CMP station associated with a spectrophotometer-based optical monitoring system. When the CMP processing is applied to the wafer, the test site undergoes the same processing as the real-features-containing area of the wafer. Thereafter, the processed wafer is transferred to the monitoring system, which may and may not be mounted within the CMP station, and measurements are applied to the test site on the wafer. The analysis of the measurement results allows for adjusting the working parameters of the CMP tool (such as the speed and/or time of polishing) prior to applying the tool to a further wafer.

Obviously, many modifications and variations of the present invention are possible in the light of the above teachings. Those skilled in the art will readily appreciate that many modifications and changes may be applied to the invention as hereinbefore exemplified without departing from its scope, as defined in and by the appended claims.

What is claimed is:

1. A test structure, which is to be formed on a patterned structure, progressing on a production line and having a pattern area formed by spaced-apart metal-containing regions representative of real features of the patterned structure, so as to enable concurrent application of a Chemical Mechanical Planarization process to a top surface of the test structure and to a top surface of said pattern area, wherein the test structure comprises at least one pair of structures arranged in a spaced-apart relationship along a vertical axis, each of said structures comprising at least one pattern zone containing spaced-apart metal regions, the test structure thereby comprising at least one pair of vertically aligned upper and lower pattern zones, the upper and lower pattern zones in each pair having different patterns oriented with respect to each other such that the metal regions of the lower pattern are located underneath the spaces between the metal regions of the upper pattern, said upper pattern zone being disposed as a top layer of said test structure.

2. The test structure according to claim 1, wherein the upper and lower patterns in each pair have different pitch values, $\Delta_1$ and $\Delta_2$, respectively, such that $\Delta_2 = K \cdot \Delta_1$, wherein K is an integer.

3. The test structure according to claim 2, wherein the two different patterns have different values of duty cycles, $D_1$ and $D_2$, respectively.

4. The test structure according to claim 1, wherein each of the at least two structures comprises at least one additional pattern zone comprising a pattern of spaced-apart metal regions, the two patterns of each structure being different and being located in the two pattern zones aligned in a spaced-apart relationship along a horizontal axis, such that the additional lower and the additional upper patterns are different, and the metal regions in the additional lower pattern are located underneath the spaces between the metal regions of the additional upper pattern.

5. The test structure according to claim 4, wherein the upper and lower structures of said at least one pair are identical and are shifted with respect to each other in a predetermined manner.

6. The test structure according to claim 5, wherein the upper and lower structure are rotated with respect to each other a 180°-angle.

7. The test structure according to claim 6, wherein pitches $\Delta_1$ and $\Delta_2$ and duty cycles $D_1$ and $D_2$ of the two patterns, respectively, in each of the upper and lower structures satisfy the following relationships: $\Delta_2 = K \cdot \Delta_1$; and $D_2 = 100\% \cdot (1 - K \cdot D_1 / 100\%)$, wherein K are integer numbers, thereby minimizing an overlap, along a horizontal axis, between the identical pattern zones of the upper and lower structures, and improving the optical isolation of the lower structure.

8. The test structure according to claim 1, wherein the upper and lower patterns have different pitch values and equal values of duty cycles, the upper and lower structures being shifted with respect to each other along a horizontal axis by half the pattern period, thereby minimizing an overlap, along a horizontal axis, between the upper and lower pattern zones and improving the optical isolation of the lower pattern structure.

9. The test structure according to claim 1, wherein upper and lower patterns in the upper and lower pattern zones, respectively, are different in that they are aligned along two mutually perpendicular horizontal axes, such that the metal regions in the upper and lower patterns are perpendicular to each other.

10. The test structure according to claim 1, and also comprising at least one additional pattern zone comprising a pattern of spaced-apart metal regions, the three patterns being located in three spaced-apart layers presenting three structures, respectively, aligned in a spaced-apart relationship along the vertical axis, a construction being such that the patterns in each two locally adjacent structures are different and are oriented with respect to each other such that the metal regions of the lower pattern are located underneath the spaces between the metal regions of the upper pattern.

11. A patterned structure that has a pattern area formed by spaced-apart metal-containing regions representative of real features of the patterned structure, and is formed with a test site containing a test structure, which comprises at least one pair of structures arranged in a spaced-apart relationship along a vertical axis, each of said structures comprising at least one pattern zone containing spaced-apart metal regions, the test structure thereby comprising at least one pair of vertically aligned upper and lower pattern zones, the upper and lower pattern zones in each pair having different patterns oriented with respect to each other such that the metal regions of the lower pattern are located underneath the spaces between the metal regions of the upper pattern, said upper pattern zone being disposed as a top layer of said test structure.

12. The patterned structure according to claim 11, being a semiconductor wafer progressing on a production line in a process of manufacturing semiconductor devices, the upper and lower structures of the test structure being spaced by a dielectric layer, and the metal regions in the pattern zone being spaced by dielectric regions.

13. The patterned structure according to claim 11, wherein each of the at least two structures of the test structure comprises at least one additional pattern zone comprising a pattern of spaced-apart metal regions, the two patterns of each structure being different and being located in the two pattern zones aligned in a spaced-apart relationship along a horizontal axis, such that the additional lower and the additional upper patterns are different, and the metal regions in the additional lower pattern are located underneath the spaces between the metal regions of the additional upper pattern.

14. The patterned structure according to claim 12, being a semiconductor wafer progressing on a production line in a process of manufacturing semiconductor device, the upper and lower structures of the test structure being spaced by a dielectric layer, the metal regions in the pattern zone being spaced by dielectric regions, and the pattern zones in each of the upper and lower structures being spaced by a dielectric zone.

15. A method of controlling a process of Chemical Mechanical Planarization (CMP) applied to a group of similar patterned structures progressing on a production line, each pattern structure having a pattern area formed by spaced-apart metal-containing regions representative of real features of the patterned structure, the method comprising the steps of:

(a) forming at least one of the patterned structures progressing on a production line with a test site containing a test structure, which comprises at least one pair of structures arranged in a spaced-apart relationship along a vertical axis, each of said structures comprising at least one pattern zone containing spaced-apart metal regions, the test structure thereby comprising at least one pair of vertically aligned upper and lower pattern zones, the upper and lower pattern zones in each pair having different patterns oriented with respect to each other such that the metal regions of the lower pattern are located underneath the spaces between the metal regions of the upper pattern, said upper pattern zone being disposed as a top layer of said test structure;

(b) applying the CMP process to the test site, thereby processing both the test structure and the pattern area;

(c) applying optical measurements to the processed test structure to detect an optical response of the test structure, wherein the optical response is substantially not affected by a light response of layers of the test structure located underneath the lower structure;

(d) analyzing the detected optical response to determine whether there exists at least one of erosion and dishing effects caused by the CMP processing, the analysis of the optical response enabling to adjust a working parameter of the CMP process prior to applying the CMP process to another patterned structure.

16. The method according to claim 15, wherein step (i) comprising the step of forming each of the at least two structures of the test structure with at least one additional pattern zone comprising a pattern of spaced-apart metal regions, the two patterns of each structure being different and being located in the two pattern zones aligned in a spaced-apart relationship along a horizontal axis and being spaced by a dielectric zone, such that the additional lower and the additional upper patterns are different, the metal regions in the additional lower pattern being located underneath the spaces between the metal regions of the additional upper pattern.

17. The method according to claim 15, wherein measurement results include information on at least one of the following: erosion effect, local dishing effect, and metal regions thickness.

18. The method according to claim 16, wherein measurement results include information on at least one of the following: erosion effect, local dishing effect, and metal regions thickness obtained by the measurements in the upper pattern zone containing the pattern with relatively small pitch as compared to the other upper pattern zone; the dielectric zone thickness used for the metal level determining, and metal removal obtained by the measurements in the upper pattern zone containing the pattern with the relatively large pitch value.

19. A test structure, which is to be formed on a patterned structure, progressing on a production line and having a pattern area formed by spaced-apart metal-containing regions representative of real features of the patterned structure, so as to enable concurrent application of a Chemical Mechanical Planarization process to a top surface of the test structure and to a top surface of said pattern area, wherein the test structure comprises at least two structures aligned along a vertical axis in a spaced-apart parallel relationship, each structure comprising at least one pattern zone containing spaced-apart metal regions, the test structure thereby comprising at least one pair of vertically aligned upper and lower pattern zones, the upper and lower pattern zones in each pair having different patterns oriented with respect to each other such that the metal regions of the lower pattern are located underneath the spaces between the metal regions of the upper pattern, wherein the upper and lower patterns in each pair have different pitch values, $\Delta_1$ and $\Delta_2$, respectively, such that $\Delta_2 = K \cdot \Delta_1$, wherein K is an integer.

20. A test structure, which is to be formed on a patterned structure, progressing on a production line and having a pattern area formed by spaced-apart metal-containing regions representative of real features of the patterned structure, so as to enable concurrent application of a Chemical Mechanical Planarization process to a top surface of the test structure and to a top surface of said pattern area, wherein the test structure comprises at least two structures aligned along a vertical axis in a spaced-apart parallel relationship, each structure comprising at least one pattern zone containing spaced-apart metal regions, the test structure thereby comprising at least one pair of vertically aligned upper and lower pattern zones, the upper and lower pattern zones in each pair having different patterns oriented with respect to each other such that the metal regions of the lower pattern are located underneath the spaces between the metal regions of the upper pattern, wherein each of the at least two structures comprises at least one additional pattern zone comprising a pattern of spaced-apart metal regions, the two patterns of each structure being different and being located in the two pattern zones aligned in a spaced-apart relationship along a horizontal axis, such that the additional lower and the additional upper patterns are different, and the metal regions in the additional lower pattern are located underneath the spaces between the metal regions of the additional upper pattern.

21. A test structure, which is to be formed on a patterned structure, progressing on a production line and having a pattern area formed by spaced-apart metal-containing regions representative of real features of the patterned structure, so as to enable concurrent application of a Chemical Mechanical Planarization process to a top surface of the test structure and to a top surface of said pattern area, wherein the test structure comprises at least two structures aligned along a vertical axis in a spaced-apart parallel relationship, each structure comprising at least one pattern zone containing spaced-apart metal regions, the test structure thereby comprising at least one pair of vertically aligned upper and lower pattern zones, the upper and lower pattern zones in each pair having different patterns oriented with respect to each other such that the metal regions of the lower pattern are located underneath the spaces between the metal regions of the upper pattern, wherein the upper and lower patterns have different pitch values and equal values of duty cycles, the upper and lower structures being shifted with respect to each other along a horizontal axis by half the pattern period, thereby minimizing an overlap, along a horizontal axis, between the upper and lower pattern zones and improving the optical isolation of the lower pattern structure.

22. A test structure, which is to be formed on a patterned structure, progressing on a production line and having a pattern area formed by spaced-apart metal-containing regions representative of real features of the patterned structure, so as to enable concurrent application of a Chemical Mechanical Planarization process to a top surface of the test structure and to a top surface of said pattern area, wherein the test structure comprises at least two structures aligned along a vertical axis in a spaced-apart parallel relationship, each structure comprising at least one pattern zone containing spaced-apart metal regions, the test structure thereby comprising at least one pair of vertically aligned upper and lower pattern zones, the upper and lower pattern zones in each pair having different patterns oriented with respect to each other such that the metal regions of the lower pattern are located underneath the spaces between the metal regions of the upper pattern, wherein upper and lower patterns in the upper and lower pattern zones, respectively, are different in that they are aligned along two mutually perpendicular horizontal axes, such that the metal regions in the upper and lower patterns are perpendicular to each other.

23. A test structure, which is to be formed on a patterned structure, progressing on a production line and having a pattern area formed by spaced-apart metal-containing regions representative of real features of the patterned structure, so as to enable concurrent application of a Chemical Mechanical Planarization process to a top surface of the test structure and to a top surface of said pattern area, wherein the test structure comprises at least two structures aligned along a vertical axis in a spaced-apart parallel relationship, each structure comprising at least one pattern zone containing spaced-apart metal regions, the test structure thereby comprising at least one pair of vertically aligned upper and lower pattern zones, the upper and lower pattern zones in each pair having different patterns oriented with respect to each other such that the metal regions of the lower pattern are located underneath the spaces between the metal regions of the upper pattern, the test structure also comprising at least one additional pattern zone comprising a pattern of spaced-apart metal regions, the three patterns being located in three spaced-apart layers presenting three structures, respectively, aligned in a spaced-apart relationship along the vertical axis, wherein the patterns in each two locally adjacent structures are different and are oriented with respect to each other such that the metal regions of the lower pattern are located underneath the spaces between the metal regions of the upper pattern.

* * * * *